US006661642B2

(12) United States Patent
Allen et al.

(10) Patent No.: US 6,661,642 B2
(45) Date of Patent: Dec. 9, 2003

(54) DIELECTRIC STRUCTURE

(75) Inventors: Craig S. Allen, Shrewsbury, MA (US); Maria Anna Rzeznik, Framingham, MA (US); S. Matthew Cairns, Shrewsbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/268,433

(22) Filed: Oct. 10, 2002

(65) Prior Publication Data

US 2003/0128497 A1 Jul. 10, 2003

Related U.S. Application Data

(60) Provisional application No. 60/333,383, filed on Nov. 26, 2001.

(51) Int. Cl.$^7$ ................................................. H01G 4/20
(52) U.S. Cl. ........................ 361/312; 501/134; 361/311; 361/313
(58) Field of Search ................................ 361/311, 312, 361/313, 321.2, 321.5; 501/134, 135, 138, 139

(56) References Cited

U.S. PATENT DOCUMENTS

| 5,155,655 | A | 10/1992 | Howard et al. |
| 5,742,471 | A | 4/1998 | Barbee, Jr. et al. |
| 5,776,990 | A | 7/1998 | Hedrick et al. |
| 5,835,174 | A | 11/1998 | Clikeman et al. |
| 5,895,263 | A | 4/1999 | Carter et al. |
| 6,068,782 | A | 5/2000 | Brandt et al. |
| 6,093,636 | A | 7/2000 | Carter et al. |
| 6,180,252 | B1 | 1/2001 | Farrell et al. |
| 6,271,273 | B1 | 8/2001 | You et al. |
| 6,404,081 | B1 | 6/2002 | Staffiere |
| 6,420,441 | B1 | 7/2002 | Allen et al. |
| 6,432,472 | B1 | 8/2002 | Farrell et al. |

FOREIGN PATENT DOCUMENTS

| WO | WO 99/60689 | 11/1999 |
| WO | WO 01/67465 A2 | 9/2001 |

OTHER PUBLICATIONS

Zou et al., "Improved Dielectric Properties of Lead Zirconate Titanate Thin Films Deposited on Metal Foils with LaNiO$_3$ Buffer Layers", Applied Physics Letters, vol. 78, No. 9, Feb. 26, 2001, pp. 1282–1284.
Homes et al., "Optical Response of High–Dielectric Constant Perovskite–Related Oxide", Science, vol. 293, Jul. 27, 2001, pp. 673–676.
Kineri et al., "Preparation and Optical Properties of Gold–Dispersed BaTiO3 Thin Films", Journal of the Ceramic Society of Japan, 101, 1993, pp. 1340–1345.
Masaki et al., "Gold–Particle–Enhanced Crystallite Growth of Thin Films of Barium Titanate Prepared by the Sol–Gel Process", J. Am. Ceram. Soc., 81 (4), 1998, pp. 1074–1076.

*Primary Examiner*—Anthony Dinkins
(74) *Attorney, Agent, or Firm*—S. Matthew Cairns

(57) ABSTRACT

Multilayer dielectric structures particularly suitable for use in capacitors and having a plating dopant in an amount sufficient to promote plating of a conductive layer are provided, together with methods of forming such structures. Such dielectric structures show increased adhesion of subsequently applied conductive layers.

18 Claims, No Drawings

DIELECTRIC STRUCTURE

This application claims the benefit of provisional application 60/333,383, filed Nov. 26, 2001.

BACKGROUND OF THE INVENTION

The present invention relates generally to the field of dielectric structures. In particular, the present invention relates to the field of dielectric structures suitable for use in capacitor manufacture.

Laminated printed circuit boards, as well as multichip modules, serve as support substrates for electronic components, such as integrated circuits, capacitors, resistors, inductors, and other components. Conventionally, discrete passive components, e.g. resistors, capacitors and inductors, are surface mounted to the printed circuit boards. Such discrete passive components can occupy up to 60% or greater of the real estate of a printed circuit board, thus limiting the space available for the mounting of active components, such as integrated circuits. The removal of passive components from the printed circuit board surface allows for increased density of active components, further miniaturization of the printed circuit board, increased computing power, reduced system noise and reduced noise sensitivity due to shortened leads.

Such removal of discrete passive components from the printed circuit board surface can be achieved by embedding the passive components within the laminated printed circuit board structure. Embedded capacitance has been discussed in the context of capacitive planes providing non-individual or "shared" capacitance. Capacitive planes consist of two laminated metal sheets insulated by a polymer based dielectric layer. Shared capacitance requires the timed use of the capacitance by other components. Such shared capacitance fails to adequately address the need for embedded capacitors that still function as discrete components.

U.S. Pat. No. 6,068,782 (Brandt et al.) discloses a method of providing individual embedded capacitors including the steps of patterning a photoimageable low dielectric constant material on top of a bottom electrode material, depositing capacitance dielectric material by either filling or partially filling the pattern, and then fabricating a capacitor top electrode. Such capacitor dielectric material typically has a high dielectric constant, such as a ceramic or metal oxide. One problem with using such ceramics or metal oxides is that they may be difficult to metallize, i.e. to fabricate an electrode on, using techniques conventionally used in the printed circuit board industry.

Energy storage devices for semiconductors containing dielectric layers having certain dopants, such as gold, have been disclosed. See, for example, U.S. Pat. No. 6,180,252 B1 (Farrell et al.) which discloses capacitors for semiconductors containing a single dielectric layer including a gold doped barium titanate having increased storage capacity as compared to conventional capacitors. These energy storage devices are not taught for use in embeddable capacitors in the area of printed wiring boards.

There is a need for capacitors, particularly embeddable capacitors, having high dielectric constant capacitance dielectric material that are easier to fabricate electrodes on than conventional high dielectric constant capacitance dielectric material.

SUMMARY OF THE INVENTION

It has been surprisingly found that the adhesion of plated electrode layers to high dielectric constant material can be improved by providing a plating dopant in the dielectric material. Such plating dopant promotes plating of the conductive layer on the high dielectric constant material.

The present invention provides a multilayer dielectric structure having a first dielectric layer and a second dielectric layer, wherein the first dielectric layer includes a plating dopant in an amount sufficient to promote plating of a conductive layer on the first dielectric layer. Dielectric structures having a dielectric layer including a plating dopant in an amount sufficient to promote plating of a conductive layer on the dielectric layer are also contemplated by this invention. Capacitors containing such dielectric structures are further contemplated by this invention.

The present invention also provides a method of improving the adhesion of catalytic and plated electrodes to a dielectric layer including the steps of depositing on a substrate a dielectric layer including a plating dopant in an amount sufficient to promote plating of a conductive layer on the first dielectric layer, and plating a conductive layer on the surface of the dielectric layer. Such method is also used in the manufacture of capacitors. In such capacitors, the substrate is typically, in order, a bottom conductive layer and a bottom dielectric layer, with the dielectric layer being disposed on the bottom dielectric layer.

The present invention provides a printed circuit board including an embedded capacitance material, wherein the embedded capacitance material includes a multilayer dielectric structure including a first dielectric layer and a second dielectric layer, wherein the first dielectric layer includes a plating dopant in an amount sufficient to promote plating of a conductive layer on the first dielectric layer. A method of manufacturing the printed circuit board described above is also contemplated herein.

DETAILED DESCRIPTION OF THE INVENTION

As used throughout this specification, the following abbreviations shall have the following meanings, unless the context clearly indicates otherwise: ° C.=degrees Centigrade; rpm=revolutions per minute; mol=moles; hr=hours; min=minute; sec=second; nm=nanometers; cm=centimeters; in.=inches; and wt %=percent by weight.

The terms "printed wiring board" and "printed circuit board" are used interchangeably throughout this specification. "Depositing" and "plating" are used interchangeably throughout this specification and include both electroless plating and electrolytic plating. "Multilayer" refers to two or more layers. The term "dielectric structure" refers to a layer or layers of dielectric material. "Alkyl" refers to linear, branched and cyclic alkyl.

All percentages are by weight, unless otherwise noted. All numerical ranges are inclusive and combinable in any order, except where it is clear that such numerical ranges are constrained to add up to 100%.

The present invention provides a dielectric structure comprising a dielectric layer comprising a plating dopant in an amount sufficient to promote plating of a conductive layer on the dielectric layer. As used herein, "plating dopant" refers to any conductive element or compound present in the dielectric layer in an amount sufficient to promote plating of the surface of the dielectric layer with a conductive material. Such dielectric structures are particularly suitable for the fabrication of capacitors, and more particularly for the fabrication of capacitors that can be embedded within a laminated printed circuit board. Such capacitors contain a pair of electrodes (conductive layers or metal layers) on opposite sides of and in intimate contact with the capacitor dielectric material. Capacitance density is determined by the electrode surface area, the dielectric constant of the dielectric material and the thickness of the capacitor. The present invention provides an increase in electrode area for a given geometrical area and a decrease in dielectric material thickness without increasing the likelihood of short circuits.

Typically, the dielectric material useful in the present dielectric structures is any that is suitable for use as capacitor dielectric material. A wide variety of dielectric material may be suitably employed, depending upon the design requirements of the capacitor. Suitable dielectric material includes that having a dielectric constant of 2 or greater. Particularly useful dielectric materials are those having a dielectric constant of 3 or greater. In one embodiment, the dielectric material has a high dielectric constant. By "high" dielectric constant it is meant a dielectric constant $\geq 7$, and preferably >7. A wide variety of dielectric materials may suitably be used, including, but not limited to, polymers, ceramics, metal oxides and combinations thereof. Suitable polymers include, but are not limited to, epoxies, polyimides, polyurethanes, polyarylenes including polyarylene ethers, polysulfones, polysulfides, fluorinated polyimides, fluorinated polyarylenes, and the like. Suitable ceramics and metal oxides include, but are not limited to, titanium dioxide ("$TiO_2$"), tantalum oxides such as $Ta_2O_5$, barium-titanates having the formula $Ba_aTi_bO_c$ wherein a and b are independently from 0.75 to 1.25 and c is 2.5 to 5, strontium-titanates such as $SrTiO_3$, barium-strontium-titanates, lead-zirconium-titanates such as $PbZr_yTi_{1-y}O_3$, the series of doped lead-zirconium-titanates having the formula $(Pb_xM_{1-x})(Zr_yTi_{1-y})O_3$ where M is any of a variety of metals such as alkaline earth metals and transition metals such as niobium and lanthanum, where x denotes lead content and y is the zirconium content of the oxide, lithium-niobium oxides such as $LiNbO_3$, lead-magnesium-titanates such as $(Pb_xMg_{1-x})TiO_3$, and lead-magnesium-niobium oxides such as $(Pb_xMg_{1-x})NbO_3$, and lead-strontium-titanates $(Pb_xSr_{1-x})TiO_3$. When the capacitor dielectric material includes $Ba_aTi_bO_c$, it is preferred that a and b are both 1 and c is 3, i.e. $BaTiO_3$. Other suitable dielectric materials include, but are not limited to: silsesquioxanes such as alkyl silsesquioxanes, aryl silsesquioxanes, hydrido silsesquioxanes and mixtures thereof; silica; siloanes; and the like; including mixtures of any of the foregoing. Suitable alkyl silsesquioxanes include ($C_1$–$C_{10}$)alkyl silsesquioxanes such as methyl silsesquioxanes, ethyl silsesquioxanes, propyl silsesquioxanes, and butyl silsesquioxanes. It is preferred that the dielectric material includes a ceramic or metal oxide. Such dielectric materials may be used in a variety of crystal structures including, without limitation, perovskites ($ABO_3$), pyrochlores ($A_2B_2O_7$), rutile and other structural polymorphs that have suitable electrical properties for use as a capacitor dielectric.

When a polymer/ceramic or metal oxide composite capacitor dielectric material is used, the ceramic or metal oxide material may be blended as a powder with the polymer. When the ceramic or metal oxide is used without a polymer, such ceramic or metal oxide may be deposited by a variety of means, such as, but not limited to, sol-gel, physical and/or reactive evaporation, sputtering, laser-based deposition techniques, chemical vapor deposition ("CVD"), combustion chemical vapor deposition ("CCVD"), controlled atmosphere chemical vapor deposition ("CACCVD"), hydride vapor phase deposition, liquid phase epitaxy, and electro-epitaxy. Preferably, such ceramic or metal oxide material is deposited by using sol-gel techniques.

In such sol-gel processes, as exemplified herein by the deposition of a barium titanate capacitor dielectric, a non-aqueous solution of titanium alkoxide is reacted with a barium precursor at the desired stoichiometry and controllably hydrolyzed with a solvent/water solution. A thin, adherent film of the hydrolyzed alkoxide solution (or "sol") is then applied to the substrate by either dip-coating or spin-coating at 1,000 to 3,000 rpm. Multiple coatings may be required for increased film thicknesses; the films are heated at a temperature of 200 to 600° C. for about 5 to 10 minutes to volatize the organic species and to render the dried "gel" film. While the majority of the organic matter and water is removed from the films by annealing at 500° C.; the barium titanate film is still only partially crystalline.

The film is then annealed for a period of time to remove volatile organic materials. A desirable annealing temperature is 650° C. for approximately one hour. The film is preferably further annealed to improve the film's crystallinity. This latter step involves heating the film such as at a rate of 200° C./hr under dry nitrogen to a final annealing temperature of 600 to 900° C., preferably 850° C., until the desired crystallization is achieved.

Preferred as the titanium alkoxide is titanium isopropoxide. The "barium precursor" is typically the reaction product of a glycol and barium oxide. Typical glycols are ethylene glycol and propylene glycol. The glycol-barium oxide reaction product is typically diluted with an alcohol prior to the addition of the titanium alkoxide. Suitable alcohols for use as diluents include, without limitation, ethanol, isopropyl alcohol, methanol, butanol and pentanol.

During the sol-gel process, the thickness of the composite is a function of the rotation rate and the viscosity of the solution. Typically, the thickness of the composite is 100 nm or greater, more typically 250 nm or greater, and still more typically 500 nm or greater. A particularly useful thickness is in the range of 450 to 700 nm and more particularly from 475 to 600 nm. The maximum thickness, for instance of a planar thin film composite, may be determined by the number of sol-gel layers deposited onto the substrate.

In one embodiment, a fine powder of barium oxide is added to the glycol. The reaction is exothermic and the reaction mixture is continuously stirred. The reaction mixture is then diluted with an alcohol, such as 2-propanol. In addition, the titanium alkoxide is then added. To avoid rapid precipitation, the saturated glycol solution is kept at an elevated temperature, preferably 70° C. The solution is then spin coated onto a suitable substrate. In the first stage of spin coating, the solution is added at approximately 2000 rpm for a short duration. In the second stage, the rotation is increased to approximately 4000 rpm for a time sufficient to achieve uniform deposition of film. The film is then dried for at a temperature of 80 to 100° C., preferably at 90° C. The product is then subjected to a similar annealing stage as described for the sol-gel process.

In another embodiment of the invention, the coating of the substrate is prepared by first dissolving a reaction mixture of alcohol, barium diacetate and titanium alkoxide in ambient atmosphere. The solution of alkanol, acetic acid glycerol is then continuously stirred. Barium acetate is then dissolved in the mixed solution. Titanium alkoxide, such as titanium butoxide, is then added to the solution. The solution is continuously stirred for at least a couple of hours. The solution is then diluted with anhydrous alcohol, such as anhydrous methanol, acetic acid and glycerol in the approximate weight ratio of 5:5:1. The solution is then spin-coated onto a suitable substrate, typically a bottom electrode or metal layer. The spinning is preferably done at multiple stages. In the first stage, the solution is applied onto the substrate at approximately 2000 rpm for 10 sec. In the second stage, the solution is applied at a speed of 4000 rpm for a period of time to achieve uniform deposition, generally about ten seconds. The sols may also be applied to the substrate by roller coating or screen printing, among other methods.

Alternatively, the substrate to be coated with the capacitor dielectric may be dipped into the solution at an average speed of 2 to 12 cm/min (1 to 5 in/min) and preferably from 2 to 8 cm/min. The coating is then dried onto the substrate at a temperature of from 200 to 500° C.; typically films are first dried at 200° C. for 2 hours, and then baked at 400° C. for 20 minutes to remove volatile organic materials. Films are then annealed at the temperature range of 600 to 800° C. to improve crystallinity. Typically, the duration of annealing is about one hour.

A wide variety of plating dopants may be used in the present invention. The plating dopants useful in the present invention are any that promote plating of a conductive layer on the dielectric layer. Preferably, the plating dopants are conductive and more preferably the plating dopants are metallic. Such plating may be electroless metal deposition, electrolytic metal deposition, immersion plating, and the like. Suitable plating dopants include, but are not limited to, metals such as aluminum, tin, lead, palladium, cobalt, copper, silver, and gold. Additionally, metal oxides such as zinc oxide, conductive polymers, and graphite may be used. Mixtures of plating dopants may be advantageously used, such as palladium/tin mixtures. Preferred plating dopants are tin, palladium, cobalt, copper, silver, gold, zinc oxide and mixtures thereof.

When metallic plating dopants are used, they may be present in the dielectric layer in a variety of forms, including, but not limited to, metals, metal alloys, metal oxides or metal precursors that can be converted to conducting metal structures. The metal, metal alloys or metal oxides may be used as particles, needles, rods, crystallites or other suitable structures. Suitable plating dopant metal precursors are converted to conducting metal structures by heat, light or other external means. Exemplary plating dopant metal precursors include, without limitation, metal organic deposition reagents, and silver halide materials. It is preferred that the metal or metal alloy particles are fine particles (1 nm to 10 μm). Such fine metal or metal alloy particles may be prepared by a variety of means, such as, but not limited to, combustion chemical vapor deposition, mechanical milling, etching of biphasic monoliths, ultrasound, chemical reduction, vacuum deposition.

A wide variety of conductive polymers are known. Any of these are suitable for use as plating dopants in the present invention. It is preferred that such conductive polymers are stable upon heating to >300° C., preferably >400° C., and more preferably >500° C.

Plating dopants are present in the dielectric layer in an amount sufficient to promote plating of a conductive layer on the dielectric layer. The minimum amount necessary will depend upon the particular plating dopant and the conductive layer to be deposited. For example, when the conductive layer is to be deposited electrolytically, the plating dopant must be present in an amount to be sufficiently conductive to allow for electroplating of the conductive layer. When the conductive layer is to be deposited by immersion plating, sufficient plating dopant that is more electropositive than the metal to be deposited must be present in an amount sufficient to allow the necessary displacement plating to occur. Such minimum amounts are well within the ability of those skilled in the art. The plating dopants may typically be present in the dielectric layer in an amount of up to 50% by volume. Preferred amounts of plating dopant are up to 45% by volume and more preferably up to 40% by volume. When sol-gel processes are used to deposit the capacitor dielectric layers, it is preferred that the plating dopant is added to the sol prior to film formation. When vapor phase deposition methods are used, it is preferred that the plating dopant is co-deposited with the dielectric material. It is preferred that the plating dopant-containing dielectric layers of the present invention are deposited by sol-gel processes.

Such doped dielectric layers of the capacitor dielectric material provide increased adhesion for subsequently deposited or plated catalytic and/or electrode layers. These plating dopant-containing dielectric layers are in ohmic contact with the electrode structures on the top and bottom of the dielectric stack and thereby increase their surface areas and, as a result, their capacitance. Because the plating dopant-containing dielectric replaces layers of undoped dielectric, the overall dielectric thickness is reduced and the capacitance is increased. The effective area of the top and bottom electrodes is also increased by the surface area of the plating dopant particles that are in electrical contact with the top and bottom electrodes.

The dielectric structures of the present invention may contain two or more capacitor dielectric layers. When two capacitor dielectric layers are used, the first or top capacitor dielectric layer, i.e. the dielectric layer to be plated with a conductive layer, contains a plating dopant in an amount sufficient to provide direct plating of a conductive layer. When three or more dielectric layers are used, the first or top dielectric layer and optionally the bottom dielectric layer contain a plating dopant in an amount sufficient to provide direct plating of a conductive layer. In one embodiment, it is preferred that the both the top and bottom dielectric layers in a multilayer dielectric structure contain a plating dopant in an amount sufficient to provide direct plating of a conductive layer on the surface of each of the top and bottom dielectric layers.

Particularly suitable multilayer dielectric structures are those having a first or top dielectric layer, a second or middle dielectric layer and a third or bottom dielectric layer, wherein at least one of the top and bottom dielectric layers comprises a plating dopant in an amount sufficient to provide direct plating of a conductive layer on at least one of the top and bottom dielectric layers. It will be appreciated by those skilled in the art that such middle dielectric layer may comprise a single dielectric layer or a plurality of dielectric layers. Such plurality of dielectric layers allows for the fabrication of a dielectric structure having a tailored overall dielectric constant.

When multiple dielectric layers are used, each of the dielectric layers may be the same or different. In one embodiment, it is preferred that the dielectric layers comprise the same dielectric materials. In an alternate embodiment, it is preferred that different dielectric materials are used to form the various dielectric layers. An example of a suitable combination of different dielectric materials are alternating layers of one or more of alumina, zirconia, barium-strontium-titanate, lead-zirconium-titanate, and lead-lanthanum-zirconia-titanate, either by themselves or in combination with one or more other dielectric layers.

In one embodiment, the present doped dielectric layer may be used as the topmost layer in a dielectric stack to provide a subsequently deposited metal layer. By "dielectric stack" it is meant two or more dielectric layers in intimate contact. In this embodiment, the layers under the doped dielectric layer may be deposited by any suitable means, such as, but not limited to, sol-gel techniques, CVD, CCVD, CACCVD or any combination of these. Such dielectric layers under the present doped dielectric layer may be composed of any suitable dielectric material which may be the same as, or different from, the dielectric material used in the doped dielectric layer.

The overall thickness of the dielectric structure depends upon the capacitor dielectric material selected as well as the total capacitance desired. In multilayer dielectric structures, the dielectric layers may be of uniform thickness or varying thickness. Such structures may consist of many thin layers, one or more thick layers or a mixture of thick and thin layers. Such selections are well within the ability of those skilled in the art. Exemplary dielectric layers may have a thickness of 0.01 to 100 $\mu$m.

Preferably, the thickness of the doped dielectric layer is <50% of the total thickness of the dielectric structure. It is further preferred that the thickness of the doped dielectric layer is <40%, more preferably <30% and still more preferably <25% of the total thickness of the dielectric structure.

The entire dielectric structure may then be heated (annealed) to provide the dielectric structure having the desired crystal structure. In an alternate embodiment, the non-plating dopant-containing gel layers are first annealed to form the desired crystallinity, followed by deposition of the plating dopant-containing sol. The plating dopant-containing sol is then heated to form the gel and then annealed to provide the desired crystallinity.

In a further embodiment, the capacitor dielectric surfaces may be textured to further improve adhesion of the conductive layer. Such texturing may be achieved by a variety of means, including, but not limited to, laser structuring, use of removable porogens, and mechanical means such as physical abrasion. The removable porogens may be polymers such as polymeric particles, linear polymers, star polymers or dendritic polymers, or may be monomers or polymers that are co-polymerized with a dielectric monomer to form a block copolymer having a labile (removable) component. In an alternative embodiment, the porogen may be prepolymerized or pre-reacted with the dielectric precursor to form the sol which may be monomeric, oligomeric or polymeric. Such pre-polymerized material is then annealed to form a dielectric layer. Suitable porogens are those disclosed in, for example, U.S. Pat. No. 6,271,273 (You et al.), U.S. Pat. No. 5,895,263 (Carter et al.) and U.S. Pat. No. 6,420,441 (Allen et al.). Methods that provide a suitably textured surface while providing control of the resulting dielectric constant are preferred.

Laser structuring of the dielectric surface may be by any laser structuring or ablation methods known in the art. In such methods, the last capacitor dielectric layer applied to the dielectric structure is subjected to laser structuring, such as laser ablation, prior to the deposition of an electrode (metallization) layer. Such laser ablation is typically computer controlled, thus allowing removal of precise amounts of capacitor dielectric material in a predetermined pattern. Exemplary patterns include, without limitation, grooves, dimples, ripples, cross-hatching nooks and crannies.

The present dielectric structures having a top dielectric layer containing a plating dopant in an amount to provide direct plating of a conductive layer on the dielectric layer may be metallized by a variety of methods, including, without limitation, electroless plating, electrolytic plating, and immersion plating. Suitable conductive layers include, but are not limited to, metals such as copper, silver, gold, nickel, tin, lead, aluminum, tin-lead, tin-copper, tin-bismuth, tin-silver, tin-silver-copper, platinum, and palladium, metal oxides, conductive polymers and the like. Such conductive layers may be further alloyed with any suitable alloying metal, such as, but not limited to, bismuth, indium, and antimony.

Electroless plating may suitably be accomplished by a variety of known methods. Suitable metals that can be electrolessly plated include, but are not limited to, copper, gold, silver, nickel, palladium, tin, and lead. Immersion plating may be accomplished by a variety of know methods. Gold, silver, tin and lead may suitably be deposited by immersion plating. Electrolytic plating may be accomplished by a variety of known methods. Exemplary metals that can be deposited electrolytically include, but are not limited to, copper, gold, silver, nickel, palladium, tin, tin-lead, tin-silver, tin-copper, and tin-bismuth.

Those skilled in the art will appreciate that additional conductive layers may be deposited on the first conductive layer. Such additional conductive layers may be the same or different from the first conductive layer. The additional conductive layers may be deposited electrolessly, electrolytically, by immersion plating, by chemical vapor deposition, by physical vapor deposition, by CACCVD, by CCVD and by other suitable means. For example, when the conductive layer is deposited by electroless plating, such electroless deposition may be subsequently electrolytically plated to build up a thicker metal deposit. Such subsequently electrolytic deposited metal may be the same as or different from the electrolessly deposited metal.

Also contemplated by the present invention is a capacitor including a dielectric structure having a bottom dielectric layer and a top dielectric layer wherein the top dielectric layer includes a plating dopant in an amount sufficient to provide direct plating of a conductive layer on the top dielectric layer, a bottom conductive layer in intimate contact with the bottom dielectric layer and a top conductive layer in intimate contact with the top dielectric layer. In an alternate embodiment, the present invention also contemplates a capacitor including a multilayer dielectric structure having a bottom dielectric layer, a middle dielectric layer and a top dielectric layer wherein both the top and bottom dielectric layers include plating dopants in an amount sufficient to provide direct plating of a conductive layer on the dielectric layers, a bottom conductive layer in intimate contact with the bottom dielectric layer and a top conductive layer in intimate contact with the top dielectric layer. Such middle dielectric layer may be composed of a single dielectric layer or a multiplicity (i.e. two or more) dielectric layers.

The present invention provides a method of improving the adhesion of catalytic and plated electrodes to a dielectric layer including the steps of depositing on a substrate a dielectric layer including a plating dopant in an amount sufficient to provide direct plating of a conductive layer on the dielectric layer, and plating an electrode on the surface of the plating dopant-containing dielectric layer.

The capacitors of the present invention are particularly suitable for use as embedded capacitors in laminated printed circuit boards. Such capacitors are embedded in a laminate dielectric during the manufacture of laminated printed circuit boards. The laminate dielectrics are typically organic polymers such as epoxies, polyimides, fiber reinforced epoxies and other organic polymers used as dielectrics in the manufacture of printed circuit boards. In general, laminate dielectrics have a dielectric constant≦6, and typically have a dielectric constant in the range of 3 to 6. The present capacitors may be embedded by a variety of means known in the art, such as those disclosed in U.S. Pat. No. 5,155,655 (Howard et al.).

Accordingly, the present invention provides a method of manufacturing a multilayer laminated printed circuit board comprising the step of embedding a capacitance material in one or more layers of the multilayer laminated printed circuit board, wherein the embedded capacitance material comprises a multilayer dielectric structure comprising a first dielectric layer and a second dielectric layer, wherein the first dielectric layer comprises a plating dopant in an amount sufficient to promote plating of a conductive layer on the first dielectric layer.

The following examples are presented to illustrate further various aspects of the present invention, but are not intended to limit the scope of the invention in any aspect.

EXAMPLE 1

Barium acetate, $Ba(CH_3COO)_2$, (1 mol) is dissolved in a mixed solution of 20 mol ethanol, 25 mol acetic acid, and 1 mol glycerol, and then the solution is stirred for 2 hr. After stirring, 1 mol of $Ti[O(CH_2)_3CH_3]_4$ is added to the solution, followed by stirring for another 2 hr to prepare a barium titanate sol.

A sample of this sol is spin coated on a conductive substrate at 2000 rpm for 45 sec. After the solution is spin coated, the sample is annealed at 170° C. for 1 hr in a nitrogen-gas atmosphere, followed by two steps of successive annealing of 400° C. for 1 hr and 700° C. for 1 hr in air. The thickness of the annealed dielectric sample prepared using this procedure is ~100 nm.

To another sample of the sol is added metallic silver particles as plating dopant in an amount sufficient to provide 40% by volume, based on the total volume of the sol. The plating dopant-containing sol is then applied to the dielectric surface of the annealed dielectric sample using the conditions disclosed above. The sample is then processed at 400° C. for 1 hr to form the gel. Final phase transformation to the perovskite crystal structure is carried out at 700° C. to provide a dielectric structure having a top dielectric layer containing silver as plating dopant.

EXAMPLE 2

The dielectric structure of Example 1 is subjected to an electroless nickel plating bath to deposit a nickel conductive layer on the silver-doped dielectric layer. The nickel plated dielectric is next subjected to a nickel electroplating bath to increase the thickness of the nickel deposit.

EXAMPLE 3

The procedure of Example 2 is repeated except that the electrolessly nickel plated dielectric is subjected to a copper electroplating bath to deposit a layer of copper on the electroless nickel layer.

EXAMPLE 4

The procedure of Example 1 is repeated except that the plating dopant is palladium in an amount sufficient to provide 35% by volume.

EXAMPLE 5

The procedure of Example 1 is repeated except that the plating dopant is a mixture of palladium and tin. The total amount of palladium and tin is sufficient to provide 45% by volume.

EXAMPLE 6

The procedure of Example 1 is repeated except that the plating dopant is zinc oxide in an amount sufficient to provide 42% by volume.

EXAMPLE 7

The procedure of Example 1 is repeated except that the plating dopant is nickel in an amount sufficient to provide 48% by volume.

EXAMPLE 8

The dielectric structure of Example 4 is subjected to an electroless nickel plating bath to deposit a nickel conductive layer on the palladium-doped dielectric layer. The nickel plated dielectric is next subjected to a nickel electroplating bath to increase the thickness of the nickel deposit.

EXAMPLE 9

The dielectric structure of Example 4 is subjected to an electrolytic nickel plating bath to deposit a nickel conductive layer on the palladium-doped dielectric layer.

EXAMPLE 10

The procedure of Example 1 is repeated except that the plating dopant is copper in an amount sufficient to provide 38% by volume.

EXAMPLE 11

The dielectric structure of Example 10 is subjected to a silver immersion plating bath to deposit a silver conductive layer on the copper-doped dielectric layer.

EXAMPLE 12

The dielectric structure of Example 10 is subjected to a tin-silver electroplating bath to deposit a tin-silver conductive layer on the copper-doped dielectric layer.

EXAMPLE 13

A layer of aluminum is deposited on the dielectric structure of Example 10 by sputtering.

EXAMPLE 14

The procedure of Example 1 is repeated except that sol also contains strontium and the plating dopant is nickel in an amount sufficient to provide 27% by volume.

What is claimed is:

1. A multilayer dielectric structure having a first dielectric layer and a second dielectric layer, wherein the first dielectric layer comprises a plating dopant in an amount sufficient to promote plating of a conductive layer on the first dielectric layer.

2. The multilayer dielectric structure of claim 1 wherein the plating dopant is metallic.

3. The multilayer dielectric structure of claim 1 wherein the plating dopant is present in the first dielectric layer in an amount of up to 50% by volume.

4. The multilayer dielectric structure of claim 1 further comprising a third dielectric layer disposed on the second dielectric layer, wherein the third dielectric layer comprises a plating dopant in an amount sufficient to promote plating of a conductive layer on the third dielectric layer.

5. The multilayer dielectric structure of claim 1 wherein the second dielectric layer comprises a plurality of dielectric layers.

6. A printed circuit board comprising an embedded capacitance material, wherein the embedded capacitance material comprises the multilayer dielectric structure of claim 1.

7. A method of manufacturing a multilayer laminated printed circuit board comprising the step of embedding a capacitance material in one or more layers of a multilayer laminated printed circuit board, wherein the embedded capacitance material comprises the multilayer dielectric structure of claim 1.

8. A dielectric structure having a dielectric layer comprising a plating dopant in an amount sufficient to promote plating of a conductive layer on the dielectric layer.

9. A method of manufacturing a capacitor comprising the steps of depositing on a substrate a dielectric layer comprising plating dopant in an amount sufficient to promote plating of a conductive layer on the first dielectric layer, and plating a conductive layer on the surface of the dielectric layer.

10. The method of claim 9 wherein the plating dopant is metallic.

11. The method of claim 9 wherein the plating dopant is present in the dielectric layer in an amount of up to 50% by volume.

12. The method of claim 9 wherein the substrate comprises a bottom conductive layer and a bottom dielectric layer disposed on the bottom conductive layer.

13. The method of claim 9 wherein the conductive layer is a metal, metal oxide or conductive polymer.

14. A capacitor comprising a dielectric structure having a bottom dielectric layer and a top dielectric layer wherein the top dielectric layer comprises a plating dopant in an amount sufficient to promote plating of a conductive layer on the top dielectric layer, a bottom conductive layer in intimate contact with the bottom dielectric layer and a top conductive layer in intimate contact with the top dielectric layer.

15. The capacitor of claim 14 wherein the plating dopant is metallic.

16. The capacitor of claim 14 wherein the plating dopant is present in the dielectric layer in an amount of up to 50% by volume.

17. The capacitor of claim 14 further comprising a dielectric layer disposed between the top and bottom dielectric layers.

18. The capacitor of claim 17 wherein the bottom dielectric layer comprises a plating dopant in an amount of up to 50% by volume.

* * * * *